US011226663B2

(12) United States Patent
Guy et al.

(10) Patent No.: US 11,226,663 B2
(45) Date of Patent: Jan. 18, 2022

(54) METHODS, SYSTEMS, ARTICLES OF MANUFACTURE AND APPARATUS TO REDUCE TEMPERATURE OF A NETWORKED DEVICE

(71) Applicant: Intel Corporation, Santa Clara, CA (US)

(72) Inventors: Wey-Yi Guy, Beaverton, OR (US); Aarti Gokhale, Hillsboro, OR (US); Gaurish Deuskar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 348 days.

(21) Appl. No.: 16/024,327

(22) Filed: Jun. 29, 2018

(65) Prior Publication Data

US 2019/0041926 A1 Feb. 7, 2019

(51) Int. Cl.
*G06F 1/20* (2006.01)
*H04L 12/721* (2013.01)
*H05K 7/20* (2006.01)
*G06F 1/3209* (2019.01)
*G06F 1/3234* (2019.01)

(52) U.S. Cl.
CPC ............ *G06F 1/206* (2013.01); *G06F 1/3209* (2013.01); *G06F 1/3278* (2013.01); *H04L 45/14* (2013.01); *H05K 7/20* (2013.01)

(58) Field of Classification Search
CPC ......... H05K 7/20; G06F 1/206; G06F 1/3209; G06F 1/3278; H04L 45/14; H04L 47/27; H04L 43/0876
See application file for complete search history.

(56) References Cited

U.S. PATENT DOCUMENTS

| 6,219,713 | B1* | 4/2001 | Ruutu | H04L 29/06 |
| | | | | 709/235 |
| 7,701,853 | B2* | 4/2010 | Malhotra | H04L 47/10 |
| | | | | 370/233 |
| 9,411,400 | B1* | 8/2016 | Dropps | G06F 1/3234 |
| 2005/0071451 | A1* | 3/2005 | Key | H04L 47/10 |
| | | | | 709/223 |

(Continued)

OTHER PUBLICATIONS

Garson, "Iperf for Bandwidth Testing," May 8, 2016, 12 pages. Retrieved from https://www.sd-wan-experts.com/blog/iperf-bandwidth-testing/.

(Continued)

*Primary Examiner* — Jaweed A Abbaszadeh
*Assistant Examiner* — Brian J Corcoran
(74) *Attorney, Agent, or Firm* — Hanley, Flight & Zimmerman, LLC

(57) ABSTRACT

Methods, apparatus, systems and articles of manufacture are disclosed to reduce temperature of a networked device. An example apparatus includes, a temperature threshold monitor to identify a temperature condition associated with the device, a window information retriever to retrieve a current value of a network receive capacity parameter, and a window adjustor to reduce the temperature of the device by generating a modified network receive capacity parameter, the modified network receive capacity parameter based on a ratio of the current value of the network receive capacity parameter and a decrease factor.

18 Claims, 7 Drawing Sheets

(56) References Cited

U.S. PATENT DOCUMENTS

2013/0215746 A1* 8/2013 Bhooma ................ H04L 47/24
370/235
2017/0180230 A1* 6/2017 Mao ................... H04L 47/2408

OTHER PUBLICATIONS

Information Sciences Institute, "Transmission Control Protocol; DARPA Internet Program Protocol Specification," University of Souther California, Sep. 1981, 176 pages. Retrieved from https://tools.ietf.org/html/rfc793.

Wikipedia, "TCP Congestion Control," last edited May 27, 2018, 13 pages. Retrieved from https://en.wikipedia.org/wiki/TCP_congestion_control.

* cited by examiner

METHODS, SYSTEMS, ARTICLES OF MANUFACTURE AND APPARATUS TO REDUCE TEMPERATURE OF A NETWORKED DEVICE

FIELD OF THE DISCLOSURE

This disclosure relates generally to thermal management of networked devices, and, more particularly, to methods, systems, articles of manufacture and apparatus to reduce temperature of a networked device.

BACKGROUND

In recent years, networked devices have become a ubiquitous aspect of modern society, in which the networked devices exist as mobile telephones, tablets, personal computers (PCs), Internet of Things (IoT) devices and laptops. In operation, such networked devices are expected to facilitate ever increasing voice activity and data capacities. As such, networked device manufacturers maintain competitiveness by pushing bandwidth capabilities to higher and higher levels.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
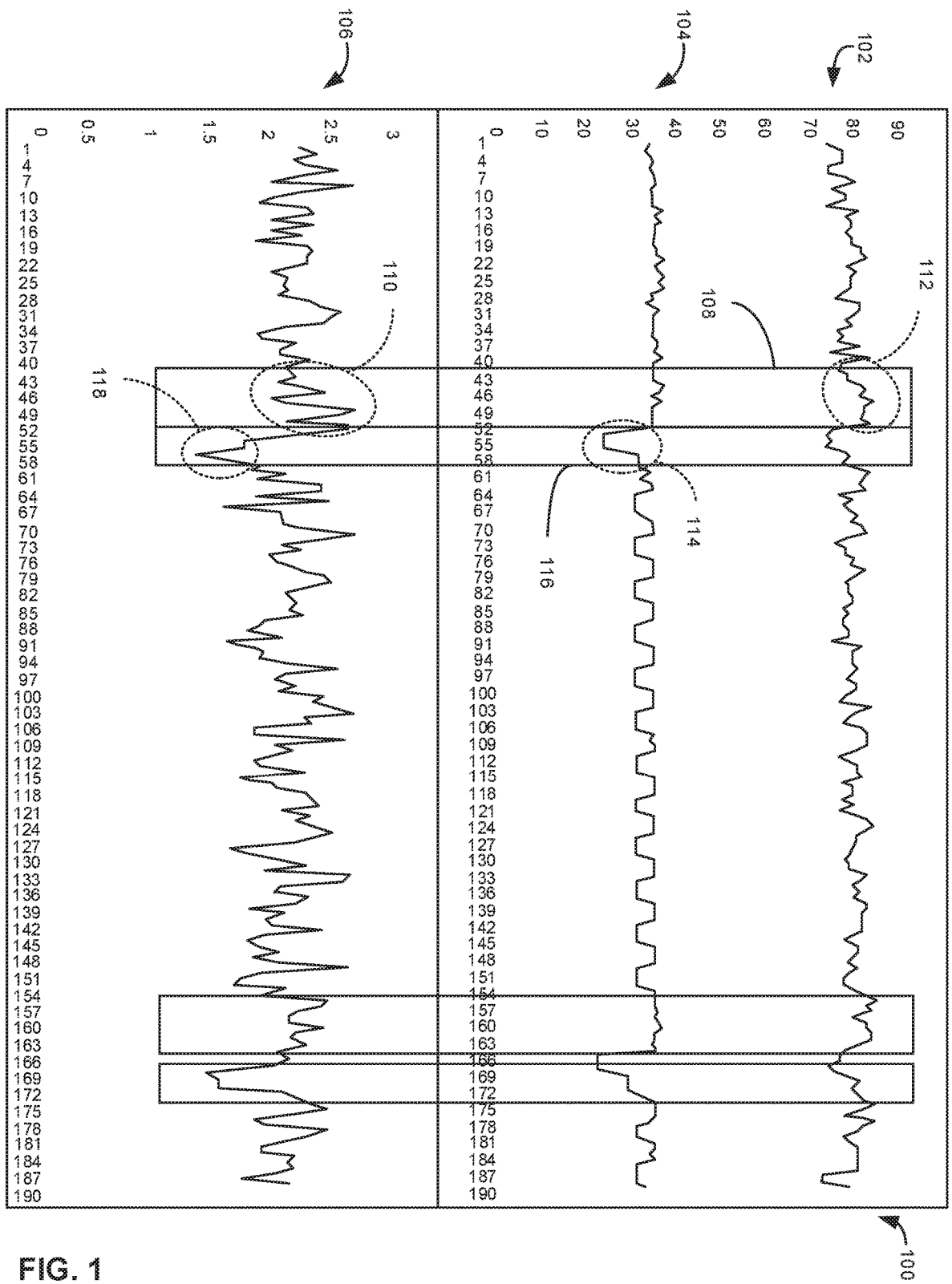
FIG. 1 is a data plot of example network device behaviors during varying network processing loads.

Transmission control protocol (TCP) is widely used for networked devices within their corresponding networks. TCP networks operate with cellular networks and/or WiFi networks for any number and/or type of networked device such as, but not limited to, mobile (e.g., cellular) telephones, mobile tablets, laptops, Internet of Things (IoT) devices, personal computers (PCs), servers and/or gaming devices (e.g., Nintendo® DS® series devices, Nintendo® Switch devices, Sony® PlayStation® devices, etc.). TCP flows include a number of packets per unit of time (e.g., packets per second) that are expected to meet standards associated with different network types, such as 4G networks, 5G networks, 802.11xx-based networks, of which WiFi is a subset and will be used interchangeably herein. In particular, as networks evolve, the expected bandwidth capabilities grow and increase demands on underlying processors, central processing units (CPUs), memory devices, communications processor(s) (CPs), applications processor(s) (APs), batteries, and/or network interfaces (e.g., network interface cards/modules) of the networked devices. Accordingly, increased bandwidth activities cause a corresponding amount of heat to be generated by the underlying processors, CPUs, memory devices, CPs, APs, batteries and/or network interfaces.

In some examples, certain networked devices are more or less susceptible to thermal increases, in which such temperature changes cause detrimental effects on the networked devices. For example, networked devices constructed with relatively poor (e.g., inexpensive) materials may fail to manage and/or otherwise exhaust thermal energy, thereby placing a user at risk (e.g., risk of burns, risk of excessive thermal energy to a battery (e.g., explosion risk, leak risk), etc.) and/or placing adjacent components at risk of elevated/ accelerated stress. In the event ambient temperatures in which the networked device operates are elevated, an increase in bandwidth exacerbates negative effects on such devices.

In some examples, networked devices include heat sinks, forced air fans and/or venting structure(s) to abate thermal energy. However, some networked devices do not have adequate space to accommodate such thermal abatement solutions (e.g., relatively smaller devices, such as wireless telephones, hand-held gaming devices, IoT devices, etc.). In some examples, networked devices employ frequency scaling when temperatures elevate beyond particular levels, in which clock frequencies of a main processor and/or auxiliary processors are reduced in an effort to reduce heat generation. While frequency scaling can reduce heat generation on the networked device, the reduction in frequency of, for example, the main processor adversely affects the performance of all aspects and/or features of the networked device. For instance, reducing the clock frequency of the main smartphone processor also reduces responsivity of the user interface, results in relatively slower memory fetch/ store operations, and causes network packets to be dropped. In circumstances where some network packets are deemed high priority (e.g., voice over Internet protocol (VoIP)), frequency scaling fails to discriminate that such packets still require priority processing efforts by the networked device. Stated differently, while frequency scaling may reduce thermal generation rate(s) of a device, such frequency scaling typically results in an overall reduction in a user's quality of experience (QoE) with the networked device.

Examples disclosed herein reduce a temperature of a networked device in a manner that preserves processor frequency settings and/or otherwise reduces QoE degradation when device temperatures increase beyond threshold limit values. Examples disclosed herein regulate a throughput of TCP flows by modifying information of TCP headers related to receiver byte limitations (e.g., advertised limits for the receiving device regarding bandwidth and/or packet quantities, such as a quantity of bytes advertised by the receiving device to prevent a sending device from inundating the receiving device). Such modifications in examples disclosed herein apply to 4G networks, 5G networks, WiFi networks, etc. in both downlink and uplink flows.

FIG. 1 is a data plot 100 to illustrate example behaviors of a network device when greater or lesser networking loads are applied thereto. In the illustrated example of FIG. 1, the data plot 100 includes a first data trace 102 indicative of a CPU temperature value (y-axis) with respect to time (x-axis). As shown in the illustrated example of FIG. 1, the first data trace includes CPU values between approximately 72 degrees Celsius and 86 degrees Celsius. The example data plot 100 of FIG. 1 includes a second data trace 104 indicative of a CPU frequency (y-axis) with respect to time (x-axis). Actual values of the CPU frequency are not identified in the illustrated example of FIG. 1, but periods of greater and lesser frequency values are apparent therein, as described in further detail below. The example data plot 100 of FIG. 1 also includes a third data trace 106 indicative of network packet throughput values in gigabits per second (Gbps). In general, the illustrated example of FIG. 1 identifies one or more problems encountered during a network packet stress test, such as execution of an iPerf tool.

In the illustrated example of FIG. 1, a first performance phase is shown outlined in a first rectangle 108. The example first performance phase exhibits a relative increase (as compared to temporal moments preceding it) in TCP flow (see encircled area 110). To support such increased network demand, the CPU increases its frequency as more packets per second are to be processed. Accordingly, the increased CPU frequency causes a corresponding temperature increase (see encircled area 112).

To avoid a heat breakdown and/or otherwise risk harm to the mobile device and its components, the CPU is scaled-down (e.g., see frequency drop of encircled area 114), during a slowdown phase 116 (second rectangle). The CPU frequency scale-down allows the CPU and/or associated circuitry to cool down. However, the CPU frequency reduction also results in a corresponding performance drop for all aspects of the network device, including a substantial drop in TCP flow (see encircled area 118). In the illustrated example of FIG. 1, transmission and/or reception packets are dropped/lost as the TCP sender enters a slow start phase and TCP throughput is dropped significantly. However, examples disclosed herein facilitate temperature reduction to occur without packet loss and without the negative effects caused by frequency scaling, which affect all aspects of the networked device.

Figure 2:
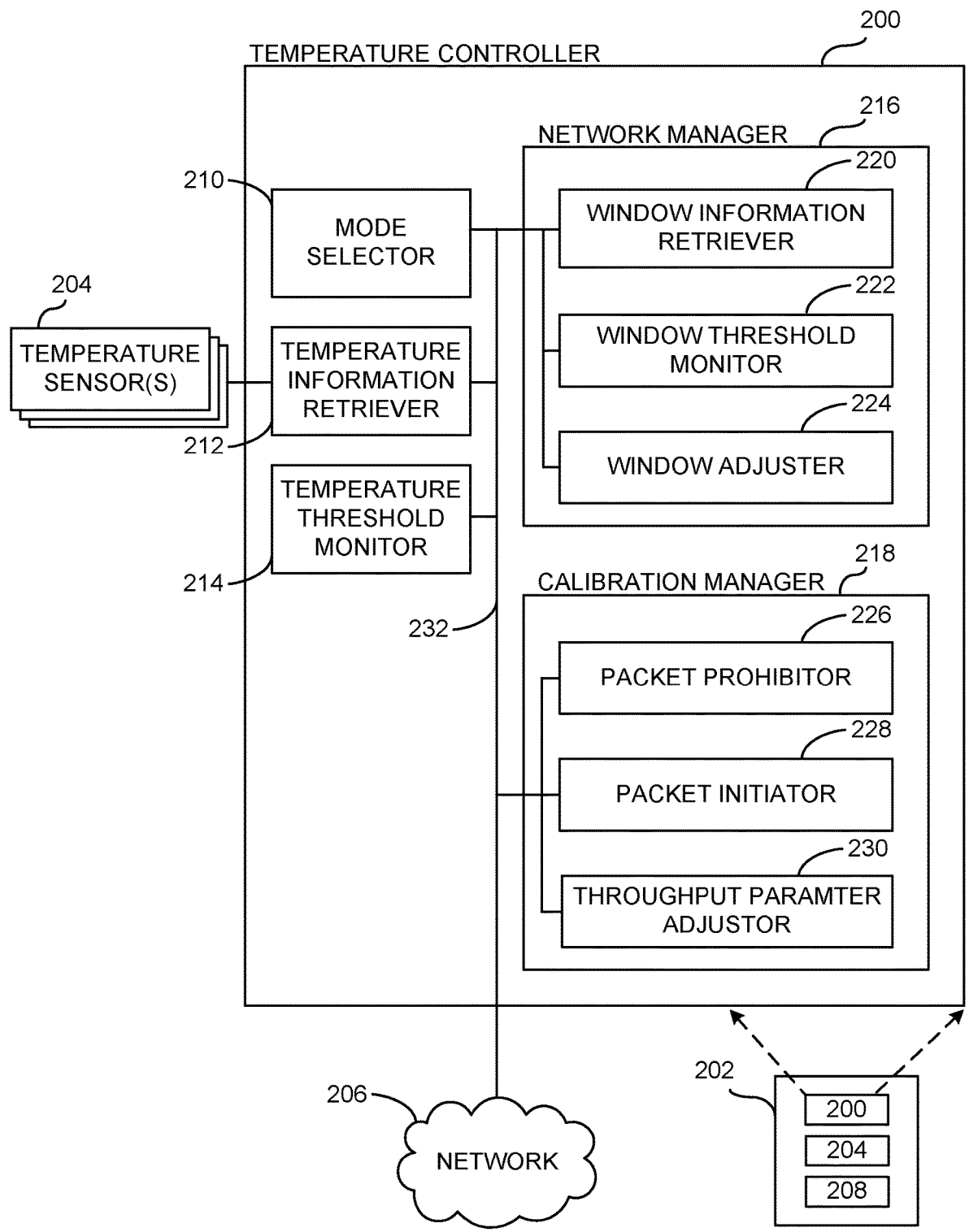
FIG. 2 is a schematic illustration of an example temperature controller to reduce temperature of a network device constructed in accordance with the teachings of this disclosure.

FIG. 2 is a schematic illustration of an example temperature controller 200 to reduce temperature of a networked device 202. In the illustrated example of FIG. 2, the temperature controller 200 is a part of the networked device 202, such as an example wireless telephone (e.g., cell phone), an example personal computer (PC) (e.g., a desktop, a laptop, a server), an example tablet, an example gaming device, an example IoT device, etc. The example temperature controller 200 is communicatively connected to one or more example temperature sensors 204 and an example network 206. In some examples, the network 206 is wireless while in other examples the network 206 is connected via one or more wires (e.g., networking cable). In still other examples, the temperature sensors 204 are wirelessly connected to the temperature controller 200, while in other examples the temperature sensors 204 are communicatively connected to the temperature controller 200 via one or more wires. Additionally, the example temperature controller 200 may be communicatively (e.g., wired and/or wireless) and/or otherwise operatively connected to components 208 that facilitate operation of the networked device 202, such as, but not limited to processors, memory devices, power devices (e.g., batteries, power input port(s)), displays, speakers, etc.

In the illustrated example of FIG. 2, the temperature controller includes an example mode selector 210, an example temperature information retriever 212, an example temperature threshold monitor 214, an example network manager 216, and an example calibration manager 218. The example network manager 216 includes an example window information retriever 220, an example window threshold monitor 222, and an example window adjuster 224. The example calibration manager 218 includes an example packet prohibitor 226, an example packet initiator 228, and an example throughput parameter adjustor 230. The aforementioned portions of the example temperature controller 200 are communicatively connected via an example bus 232 (e.g., a wired bus).

In operation, the example mode selector 210 determines whether the example temperature controller 200 is to operate in a calibration mode or a runtime mode. As described above, different networked devices (e.g., the example networked device 202 of FIG. 2) may exhibit particular sensitivities to thermal energy and/or abilities to abate the thermal energy when it increases (e.g., increases due to increased network communication bandwidth). In an effort to identify particular sensitivities associated with a networked device, the example mode selector 210 permits the example temperature controller 200 to operate in a calibration mode. As described in further detail below, the calibration mode invokes one or more packet activity "stress tests" to identify a rate of temperature change (e.g., a rate of temperature increase) of the networked device 200. In the event the example networked device exhibits a temperature increase that satisfies a threshold rate (e.g., a temperature rate that increases relatively fast), then that rate may be indicative of a networked device that fails to exhaust and/or otherwise abate thermal buildup. In such circumstances, one or more throughput adjustment parameters may be set to values that aggressively reduce packet bandwidth activity in an effort to lower device temperature. On the other hand, some devices have an ability to exhaust, manage and/or otherwise abate thermal energy buildup during periods of relatively high bandwidth packet processing. For instance, PCs and/or servers that operate on in-line (e.g., alternating current (A/C)) power sources may include forced-air venting devices that keep components (e.g., processors, memory devices, etc.) of the networked device from increasing at a relatively fast rate.

On the other hand, in the event the example mode selector 210 determines that the example temperature controller 200 is to operate in a runtime mode (e.g., one or more calibration operation(s) have previously occurred to establish throughput adjustment parameter value(s)), then the example temperature information retriever 212 retrieves temperature information from the example temperature sensor(s) 204. The example temperature threshold monitor 214 determines whether a threshold has been satisfied, such as a thermal threshold value (e.g., in degrees Celsius, degrees Fahrenheit, Kelvin) of one or more components of the example networked device 202 (e.g., temperature sensing devices on a CPU, a memory, a battery, a networking (e.g., WiFi) card, etc.). In the event a threshold value is satisfied (e.g., exceeded), the example temperature threshold monitor 214 determines whether the threshold value is indicative of an overtemperature condition (e.g., increasing values of temperature) or an undertemperature condition (e.g., decreasing values of temperature). For example, an undertemperature condition may occur in response to a prior overtemperature condition in which the example temperature controller 200 was throttling and/or otherwise constraining network bandwidth processing of the example networked device 202 in an effort to prevent further thermal runaway. As described in further detail below, example undertemperature conditions cause the example temperature controller 200 to gradually increase a network bandwidth after thermal conditions of the networked device 202 have improved (e.g., temperatures have dropped to a safe level).

In response to the example temperature threshold monitor 214 detecting an overtemperature condition, the example network manager 216 invokes the example window information retriever 220 to retrieve a current TCP receiver advertised window value ($w_f$). For example, packet network communication protocols include one or more state variables to communicate (advertise) an amount of data (e.g., $w_f$ in bytes) that a receiver (e.g., a destination side of a network communication instance) can receive. Examples disclosed herein may employ any number and/or type of packet network communication protocol including, but not limited to the Transmission Control Protocol (TCP) as defined in Request For Comments (RFC) 793 (DARPA Internet Program—September 1981). As such, a current (e.g., initial) value of the example TCP receiver advertised window ($w_f$) is retrieved by the example window information retriever 220, which may be set to an initial/default value associated with industry standard best practices, user preference, etc. As used herein, "window" represents a data container having a particular size indicative of information/data. Stated differently, an example "window" indicates an allowed number of octets that a sender may transmit. Generally speaking, the term "window" as used herein is consistent with the manner of use in RFC 793. In some examples, the TCP receiver advertised window ($w_f$) is transmitted in the header of TCP acknowledgement (ACK) messages (e.g., ACKs sent during uplink/downlink communications).

The example window threshold monitor 222 determines whether the current TCP receiver advertised window ($w_f$) satisfies (e.g., exceeds) a minimum threshold value (MIN_THRESHOLD). As used herein, the minimum threshold value (MIN_THRESHOLD) represents a lowest TCP receiver advertised window value (e.g., in bytes) to be used with the example network device 202. Conceptually, window advertisements by the network device 202 to a sending device communicate a number of bytes that the sending device should not exceed when communicating with the receiving device. Accordingly, relatively higher values of the minimum threshold value result in less potential heat reduction in the network device 202 as compared to relatively lower values of the minimum threshold value, which represent a relatively lower byte bandwidth between the sender and receiver communicating on the network.

If the example window threshold monitor 222 determines (e.g., compares) that the current TCP receiver advertised window ($w_f$) satisfies (e.g., exceeds) the minimum threshold value (MIN_THRESHOLD), then the example window adjustor 224 adjusts/modifies and/or otherwise sets (resets) the TCP receiver advertised window ($w_f$) to an updated value in a manner consistent with example Equation 1.

$$w_f = \min\left(\frac{w_f}{b}, orig_{w_f}\right). \qquad \text{Equation 1}$$

In the illustrated example of Equation 1, $orig_{w_f}$ reflects an original value of the TCP receiver advertised window ($w_f$) that was communicated in a protocol header (e.g., TCP header), and b reflects a multiplicative decrease factor. The example multiplicative decrease factor (b) may be user selected, empirically determined and/or calculated during one or more calibration procedures, as mentioned above and described in further detail below. In some examples, the multiplicative decrease factor (b) value is dependent upon characteristics (e.g., device ability to abate thermal energy per unit of time) of the network device 202 and/or a user performance profile (e.g., aggressive heat abatement activity (e.g., relatively low values of b), conservative heat abatement activity (e.g., relatively high values of b—thereby indicative that network device may be more tolerant to heat-related issues)).

In the illustrated example of Equation 1, a value for the TCP receiver advertised window ($w_f$) is updated to the lower one of (1) the ratio of the current $w_f$ and the multiplicative decrease factor b or (2) the original value of the TCP receiver advertised window ($orig_{w_f}$). In some examples, one or more other processes operating on the network device may control a value of the TCP receiver advertised window ($orig_{w_f}$), thus example Equation 1 allows such processes to continue their operations without interference. However, absent any interference from one or more other processes concerned with the TCP receiver advertised window, example Equation 1, when invoked by the example window adjustor 224, reduces a number of advertised bytes that the sender is to transmit during successive packet exchanges, in which the reduced byte value is a function of the multiplicative decrease factor b. At least one effect of applying the example multiplicative decrease factor b to modify the example TCP receiver advertised window ($w_f$) is to reduce heat generation of the example network device 202 by virtue of a reduced number of bytes to be processed.

The example network manager 216 modifies the TCP header with the updated TCP receiver advertised window ($w_f$) value, which is transmitted back to the sending device (e.g., via an ACK). In some examples, the window adjustor 224 performs network bandwidth size reductions in an iterative manner in connection with iterative temperature measurements of one or more device components. As such, each iteration lowers the advertised window ($w_f$) further in view of example Equation 1. In some examples, the network manager 216 modifies the TCP header with updated TCP receiver advertised window ($w_f$) values that are associated with particular radio bearer types. For instance, default radio bearers (e.g., a default radio bearer type) typically represent relatively low priority data and an associated relatively low QoS class identifier (QCI) value. On the other hand, dedicated radio bearers (e.g., a dedicated radio bearer type) typically represent relatively higher priority data and an associated relatively high QCI value. For instance, dedicated radio bearers typically guarantee a particular bit rate, such as dedicated bearers associated with voice over Internet protocol (VoIP) communications. Accordingly, examples disclosed herein target default radio bearers for bandwidth advertisement adjustment and exclude relatively higher priority radio bearers, thereby improving device QoS metrics during overtemperature conditions.

On the other hand, in the event the example window threshold monitor 222 determines that a current value of the TCP receiver advertised window ($w_f$) is not greater than MIN_THRESHOLD, then this circumstance is indicative of $w_f$ being set to its lowest allowable value (e.g., byte value). Stated differently, $w_f$ values are not to be set to a byte value lower than MIN_THRESHOLD, which may adversely affect a QoS of the network device beyond acceptable user expectations. In such circumstances, if the network device is still in a condition where the overtemperature condition is true, then the value of $w_f$ is maintained at its lowest byte value of MIN_THRESHOLD (e.g., until the overtemperature condition is over and a gradual increase of the TCP receiver advertised window ($w_f$) can be established).

While the illustrated example of Equation 1 employs a ratio of $w_f$ and b, examples disclosed herein are not limited thereto. In some examples, one or more reductions in byte values for the example TCP receiver advertised window ($w_f$) can be accomplished in a mathematically subtractive manner (e.g., $w_f=w_f-b$). However, such subtractive approaches to packet processing amounts are not as aggressive, thus relatively more time may be required to reduce a temperature value of the network device 202 in such examples.

In the event the example temperature threshold monitor 214 identifies an undertemperature threshold has been satisfied, the example network manager 216 invokes the example window information retriever 220 to retrieve a current value of a TCP receiver advertised window ($w_f$). Such circumstances occur in response to the example temperature threshold monitor 214 identifying a transition from the overtemperature condition to an undertemperature condition (e.g., in response to detecting that the $w_f$ advertisement adjustments are effective at reducing device temperature(s)). The example window threshold monitor 222 determines whether the current TCP receiver advertised window ($w_f$) satisfies (e.g., is less than) a maximum threshold value (MAX_THRESHOLD). As used herein, the maximum threshold value (MAX_THRESHOLD) represents a highest TCP receiver advertised window value (e.g., in bytes) to be used with the example network device 202. As described above, relatively higher values of the maximum threshold value result in less potential heat reduction in the network device 202 (e.g., a greater allowance of transmitted bytes places a relatively greater computational/processing stress on the networked device 202) as compared to relatively lower values of the maximum threshold value.

If the example window threshold monitor 222 determines (e.g., compares) that the current TCP receiver advertised window ($w_f$) satisfies (e.g., is below) the maximum threshold value (MAX_THRESHOLD), then the example window adjustor 224 adjusts and/or otherwise sets (resets) the TCP receiver advertised window ($w_f$) to an updated value in a manner consistent with example Equation 2.

$$w_f=\min(w_f+a, \text{orig}_{w_f})\qquad\text{Equation 2.}$$

In the illustrated example of Equation 2, a reflects an additive increase factor, in which values of $w_f$ represent recovery values. The example additive increase factor (a) may be user selected, empirically determined and/or calculated during one or more calibration procedures, as mentioned above and described in further detail below. In some examples, the additive increase factor (a) value is dependent upon characteristics (e.g., device ability to abate thermal energy per unit of time) of the network device 202 and/or a user performance profile.

In the illustrated example of Equation 2, a value for the TCP receiver advertised window ($w_f$) is updated to the lower one of (1) the sum of the current $w_f$ value and the additive increase factor a or (2) the original value of the TCP receiver advertised window ($\text{orig}_{w_f}$). As described above, in some examples one or more other processes operating on the network device may control a value of the TCP receiver advertised window ($\text{orig}_{w_f}$), thus example Equation 2 allows such processes to continue their operations without interference. However, absent any interference from one or more other processes concerned with the TCP receiver advertised window, example Equation 2, when invoked by the example window adjustor 224, increases a number of advertised bytes that the sender is to transmit during successive packet exchanges, in which the increased byte value is a function of the sum. At least one effect of applying the example additive increase factor a to modify the example TCP receiver advertised window ($w_f$) is to allow the network device 202 to recover (recovery value(s)) from a prior bandwidth reduction effort that is no longer problematic and/or otherwise causing thermal-related problems with the network device 202. The example network manager 216 modifies the TCP header with the updated TCP receiver advertised window ($w_f$) value, which is transmitted back to the sending device (e.g., via an ACK).

On the other hand, in the event the example window threshold monitor 222 determines that a current value of the TCP receiver advertised window ($w_f$) is not satisfied (e.g., less than) the MAX_THRESHOLD value, then this circumstance is indicative of $w_f$ being set to its highest allowable value (e.g., byte value). Stated differently, $w_f$ values are not to be set to a byte value higher than MAX_THRESHOLD. In such circumstances where $w_f$ is already set at the MAX_THRESHOLD value during an undertemperature condition, then the value of $w_f$ is maintained by the example window adjustor 224 at that maximum value.

Returning to the example mode selector 210, in the event the example temperature controller 200 is to operate in a calibration mode, then the example mode selector 210 invokes the example packet prohibitor 226 to prohibit packet activity for a dwell period/duration. Stated differently, the example packet prohibitor 226 aids in the determination of a baseline device temperature by preventing packet communications from occurring for the dwell period. Accordingly, a calculation of a rate of temperature change (e.g., a rate of temperature increase in degrees per minute) can occur in a consistent manner for any number of different devices. In response to the packet prohibitor 226 detecting an expiration of the dwell period (e.g., a duration of five minutes in which network activity and/or packet communication of the network device is prohibited), the example temperature information retriever 212 measures a baseline temperature of the network device 202.

The example packet initiator 228 invokes a packet bandwidth activity (e.g., an iPerf executable) and initiates a bandwidth timer. The example temperature information retriever 212 performs a temperature measurement and timestamps the corresponding measurement (e.g., a date, hour, minute, second timestamp), and when the packet initiator 228 determines that the bandwidth timer expires, it calculates a corresponding temperature change (e.g., temperature increase) rate (e.g., in degrees per minute). Additionally, the example packet initiator 228 halts the test packet generator.

The example throughput parameter adjustor 230 sets throughput adjustment parameter values based on the measured device temperature change rate. Example throughput adjustment parameters include, but are not limited to the example multiplicative decrease factor (b), the example minimum threshold value (MIN_THRESHOLD), the example additive increase factor (a), and/or the example maximum threshold value (MAX_THRESHOLD). Additionally, the example throughput parameter adjustor 230 applies one or more throughput adjustment parameter value overrides, if any. For example, one or more user profiles may be based on settings that bias networked device 202 thermal management in a more conservative manner, such that maximum threshold values are relatively lower (e.g., MAX_THRESHOLD is lower to reduce an overburden of network traffic on the networked device).

While an example manner of implementing the temperature controller 200 of FIG. 2 is illustrated in FIG. 2, one or more of the elements, processes and/or devices illustrated in FIG. 2 may be combined, divided, re-arranged, omitted, eliminated and/or implemented in any other way. Further, the example mode selector 210, the example temperature information retriever 212, the example temperature threshold monitor 214, the example network manager 216, the example calibration manager 218, the example window information retriever 220, the example window threshold monitor 222, the example window adjuster 224, the example packet prohibitor 226, the example packet initiator 228, the example throughput parameter adjustor 230, the example temperature sensor(s) 204 and/or, more generally, the example temperature controller 200 of FIG. 2 may be implemented by hardware, software, firmware and/or any combination of hardware, software and/or firmware. Thus, for example, any of the example mode selector 210, the example temperature information retriever 212, the example temperature threshold monitor 214, the example network manager 216, the example calibration manager 218, the example window information retriever 220, the example window threshold monitor 222, the example window adjuster 224, the example packet prohibitor 226, the example packet initiator 228, the example throughput parameter adjustor 230, the example temperature sensor(s) 204 and/or, more generally, the example temperature controller 200 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example mode selector 210, the example temperature information retriever 212, the example temperature threshold monitor 214, the example network manager 216, the example calibration manager 218, the example window information retriever 220, the example window threshold monitor 222, the example window adjuster 224, the example packet prohibitor 226, the example packet initiator 228, the example throughput parameter adjustor 230, the example temperature sensor(s) 204 and/or, more generally, the example temperature controller 200 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example temperature controller 200 of FIG. 2 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
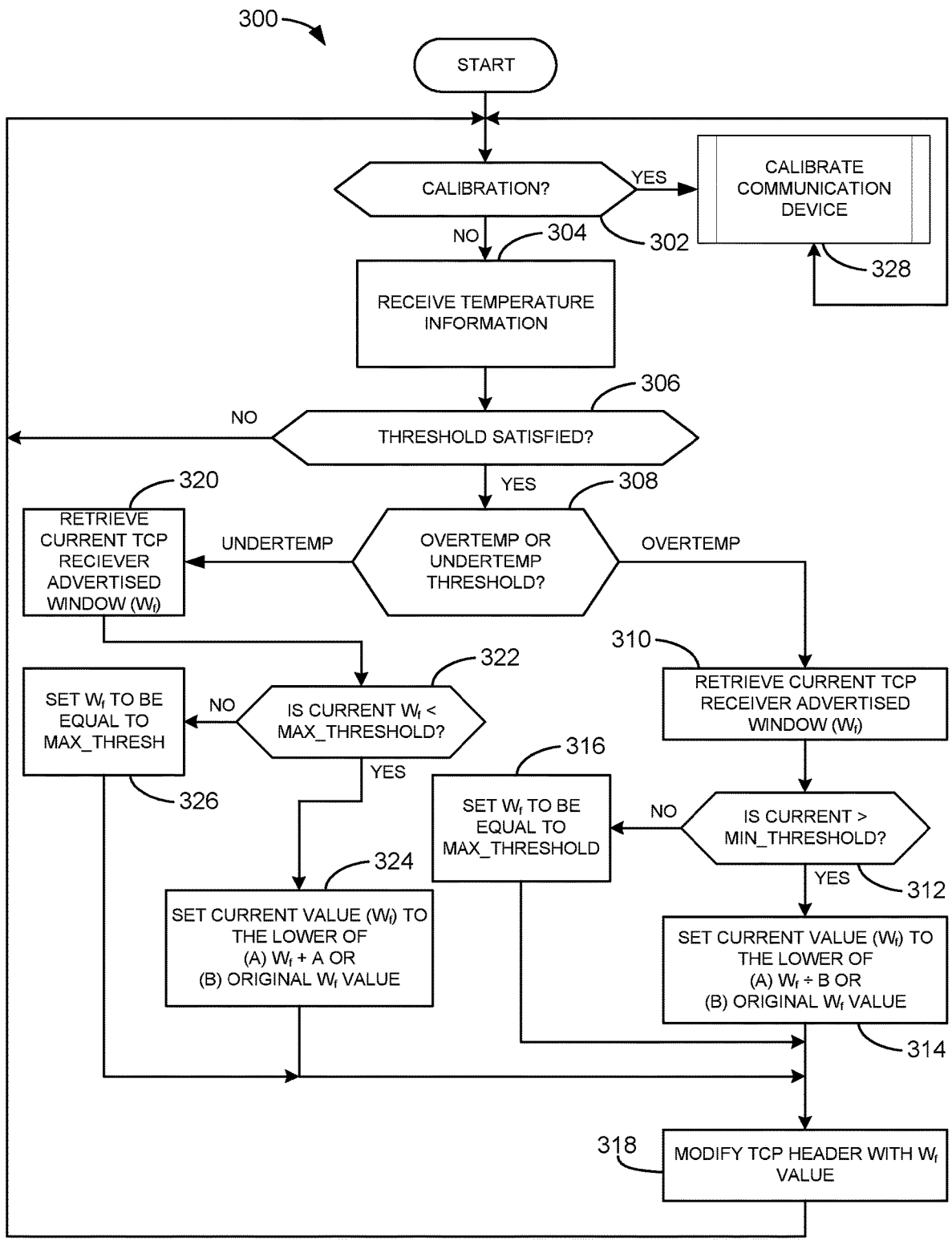
FIGS. 3-4 are flowcharts representative of machine readable instructions which may be executed to implement the example temperature controller of FIG. 2.
Figure 4:
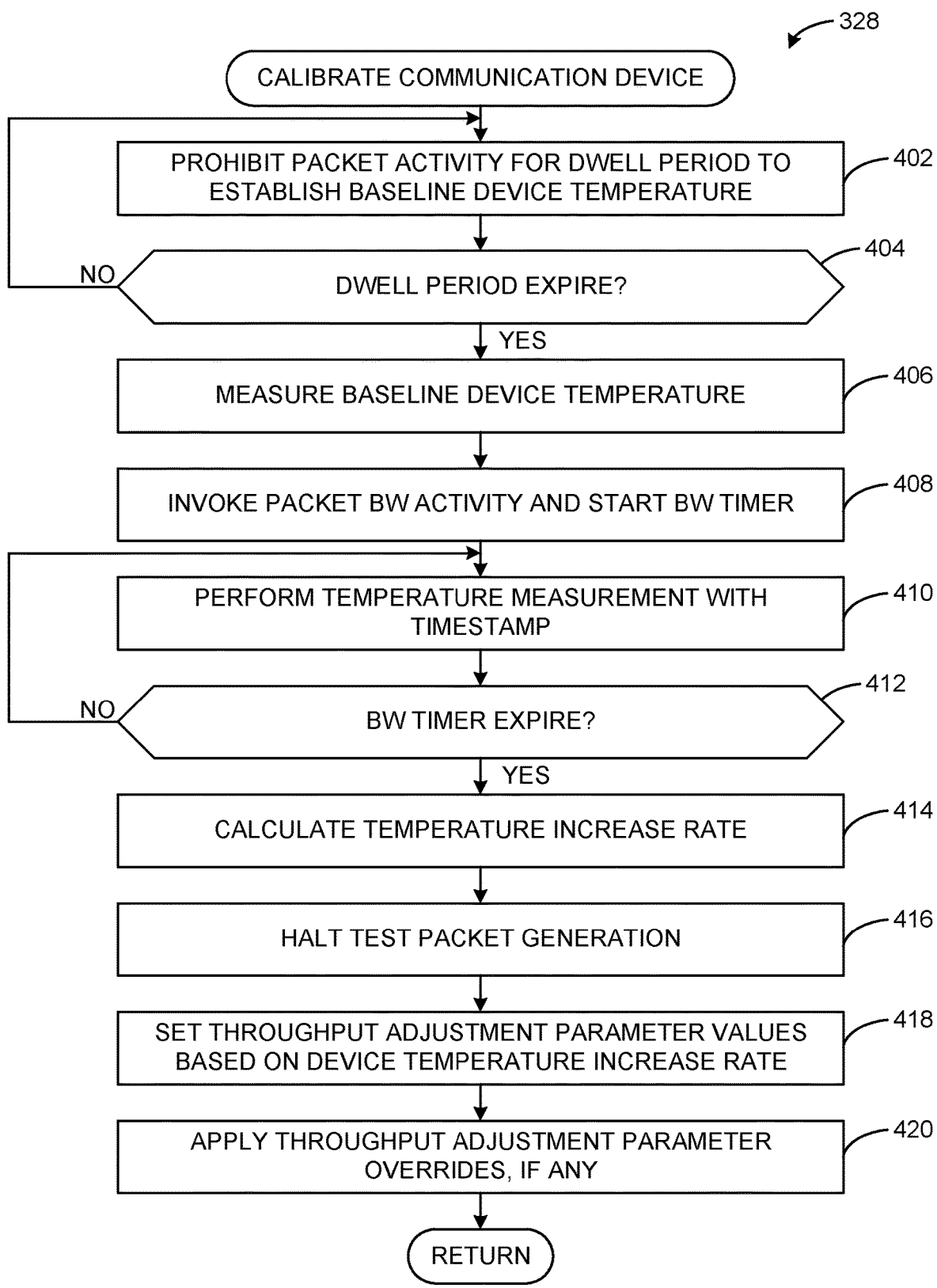

Flowcharts representative of example hardware logic, machine readable instructions, hardware implemented state machines, and/or any combination thereof for implementing the example temperature controller 200 of FIG. 2 is shown in FIGS. 3-4. The machine readable instructions may be an executable program or portion of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIGS. 3-4, many other methods of implementing the example temperature controller 200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 3-4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

The program 300 of FIG. 3 includes the example mode selector 210 to determine whether the example temperature controller 200 is to operate in a calibration mode or a runtime mode (block 302). In the event the example temperature controller 200 is to operate in a runtime mode, the example mode selector 210 invokes the example temperature information retriever 212 to retrieve temperature information (block 304). As described above, the example temperature information retriever 212 is communicatively connected to any number of example temperature sensors 204 that may be disposed on and/or otherwise proximate to components of a network device 202. The example temperature threshold monitor 214 determines whether a temperature threshold value(s) has been satisfied (e.g., exceeding a temperature threshold value indicative of an overtemperature condition, falling below a temperature threshold value indicative of an undertemperature condition, etc.) (block 306). Additionally, the example temperature threshold monitor 214 determines which type of threshold is satisfied (e.g., overtemperature or undertemperature) (block 308).

In the event an overtemperature threshold is satisfied (block 308), then the example network manager 216 invokes the example window information retriever 220 to retrieve a value of a current TCP receiver advertised window ($w_f$) (block 310). The example window threshold monitor 222 determines if the recently retrieved window ($w_f$) value exceeds a minimum threshold value (MIN_THRESHOLD) (e.g., in units of bytes, kilobytes, etc.) (block 312). Because of the aforementioned determination that the network device is experiencing an overtemperature condition (as discussed with reference to block 308), a circumstance where the window ($w_f$) value exceeds a minimum threshold value (MIN_THRESHOLD) is indicative of too much network bandwidth that, unless reduced, will cause the network device to continue generating excess heat. In such circumstances (e.g., $w_f$ is greater than MIN_THRESHOLD—block 312), the example window adjuster 224 sets a value of $w_f$ to the lower one of (1) a ratio of the current $w_f$ and the example multiplicative decrease factor (b), or (2) an original $w_f$ value (block 314). On the other hand, in the event the current value of $w_f$ is not greater than the minimum threshold value (block 312:No), then this is indicative of a current value of $w_f$ already residing at a lowest allowable value (e.g., in the event multiple iterations of program 300 have occurred to iteratively drop the $w_f$ value in an effort to reduce a temperature value of the network device). In such circumstances, the example window adjuster 224 sets the current TCP value $w_f$ to be equal to the minimum threshold value (MIN_THRESHOLD) (block 316). The updated TCP value $w_f$ is then modified by the example network manager 216 as a TCP header for communication to the sending network device (block 318).

In the event the temperature threshold monitor 214 determines that an undertemperature condition is occurring (block 308), then the example window information retriever 220 retrieves a current value of the TCP receiver advertised window $w_f$ (block 320). The example window threshold monitor 222 determines whether the retrieved current value of the TCP receiver advertised window $w_f$ is less than a maximum threshold value (MAX_THRESHOLD) (e.g., in bytes, kilobytes, etc.) (block 322). If so, the example window adjuster 224 sets/resets the current TCP receiver advertised window ($w_f$) value to the lesser of (1) a sum of the current window ($w_f$) value and an additive increase factor (a), or (2) an original $w_f$ value ($orig_{wf}$) (block 324). On the other hand, in the event the retrieved current value of the TCP receiver advertised window $w_f$ is not less than the maximum threshold value (MAX_THRESHOLD) (block 322), then the example window adjuster 224 sets and/or otherwise maintains the current window value $w_f$ to be equal to the maximum threshold value (MAX_THRESHOLD) (block 326). The example network manager 216 then modifies and/or otherwise updates a TCP header with the updated/modified TCP window $w_f$ value (block 318). Control then returns to block 302 to either iterate again in the event temperature conditions of the example network device 202 change or a calibration effort is to occur.

In the event a calibration event is to occur (block 302: Yes), the example temperature controller 200 invokes the example calibration manager 218 (block 328). FIG. 4 includes additional detail associated with block 328 of FIG. 3 to perform calibration operations of the example network device 202. In the illustrated example of FIG. 4, the example packet prohibitor 226 prohibits packet activity for a dwell period to establish a baseline device temperature (block 402). The example packet prohibitor 226 determines whether the dwell period has expired (block 404) and, if not, control returns to block 402 to wait for such an occurrence. On the other hand, when the example packet prohibitor 226 determines that the dwell period has expired (block 404: Yes), the example calibration manager 218 invokes the example temperature information retriever 212 to measure a baseline temperature (block 406).

In response to determining the baseline temperature of the network device 202, the example packet initiator 228 invokes packet bandwidth activity on the network device and starts a bandwidth timer (block 408). The example temperature information retriever 212 performs a temperature measurement and associates a corresponding date/timestamp with that measurement (block 410). The example packet initiator 228 determines whether the example bandwidth timer has expired (block 412) and, if not, control returns to block 410 for yet another temperature measurement. Stated differently, any number of temperature measurements described in connection with blocks 410-412 may occur to determine and/or otherwise calculate a temperature increase rate of the example network device 202. As described above, different types of network devices and/or network devices in different types of environments may exhibit particular nuanced responses to temperature conditions, thereby requiring different established default additive increase factor (a) values, different multiplicative decrease factor (b) values, different minimum threshold values (MIN_THRESHOLD) and/or different maximum threshold values (MAX_THRESHOLD).

In response to the example packet initiator 228 determining that the bandwidth timer has expired (block 412: YES), the example calibration manager 218 calculates a temperature increase rate associated with the network device 202 (block 414). The example packet initiator 228 halts test packet generation (block 416), and the example throughput parameter adjustor 230 sets throughput adjustment parameter values (e.g., a, b, MIN_THRESHOLD, MAX_THRESHOLD, etc.) based on the calculated temperature increase rate (block 418). Additionally, the example throughput parameter adjustor 230 applies the throughput adjustment parameter overrides (e.g., user-preferred changes/overrides), if any (block 420). Control then returns to the program 300 of FIG. 3.

Figure 5:
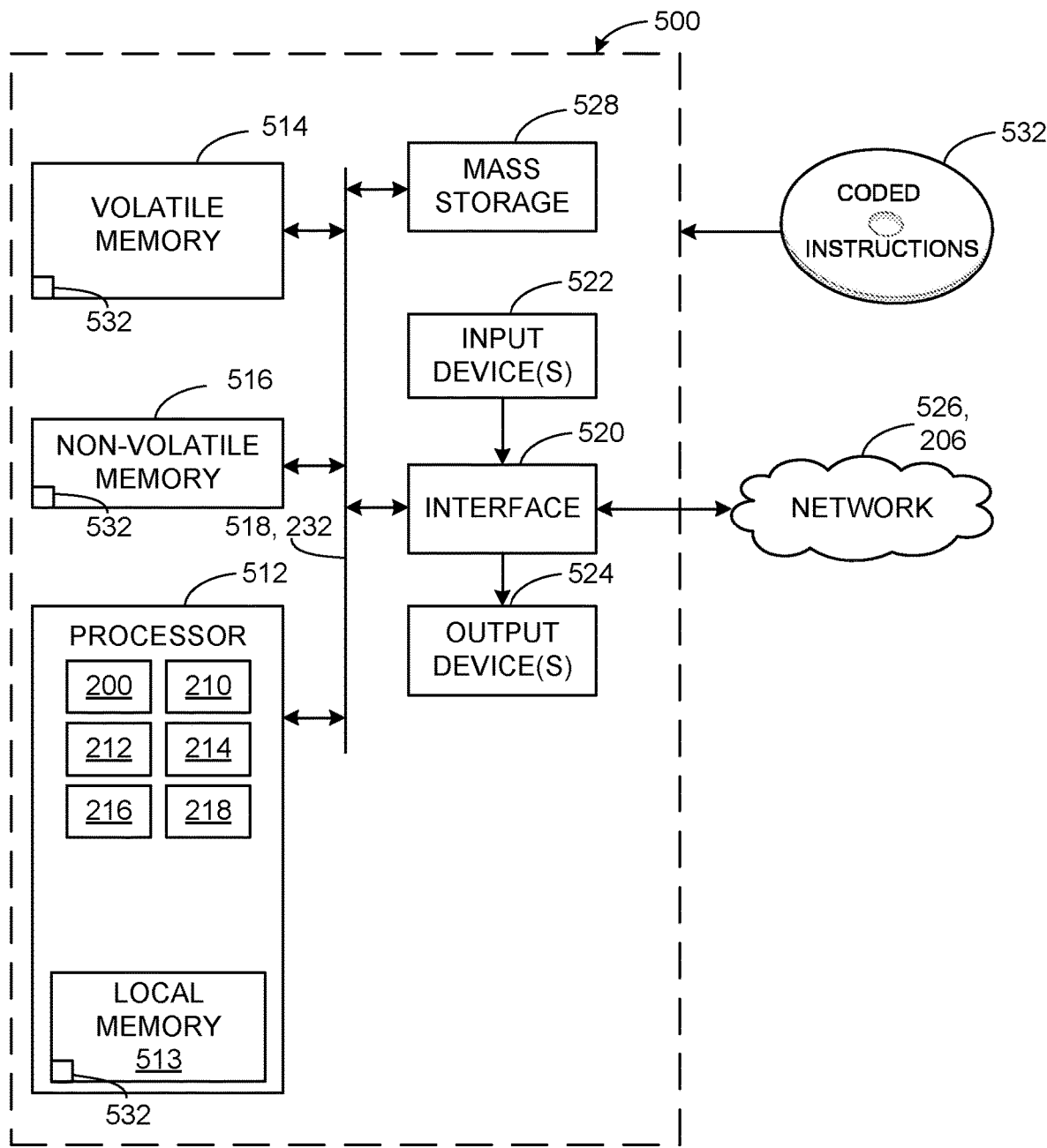
FIG. 5 is a block diagram of an example processing platform structured to execute the instructions of FIGS. 3-4 to implement the example temperature controller of FIG. 2.

FIG. 5 is a block diagram of an example processor platform 500 structured to execute the instructions of FIGS. 3-4 to implement the temperature controller 200 of FIG. 2. The processor platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example mode selector 210, the example temperature information retriever 212, the example temperature threshold monitor 214, the example network manager 216 (and components therein, including the example window information retriever 220, the example window threshold monitor 222, and the example window adjuster 224), the example calibration manager 218 (and components therein, including the example packet prohibitor 226, the example packet initiator 228, and the example throughput parameter adjustor 230) and the example temperature controller 200.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard (e.g., wired and/or wireless), such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIGS. 3-4 may be stored in the mass storage device 528, in the volatile memory 514, in the non-volatile memory 516, and/or on a removable non-transitory computer readable storage medium such as a CD or DVD.

Figure 6:
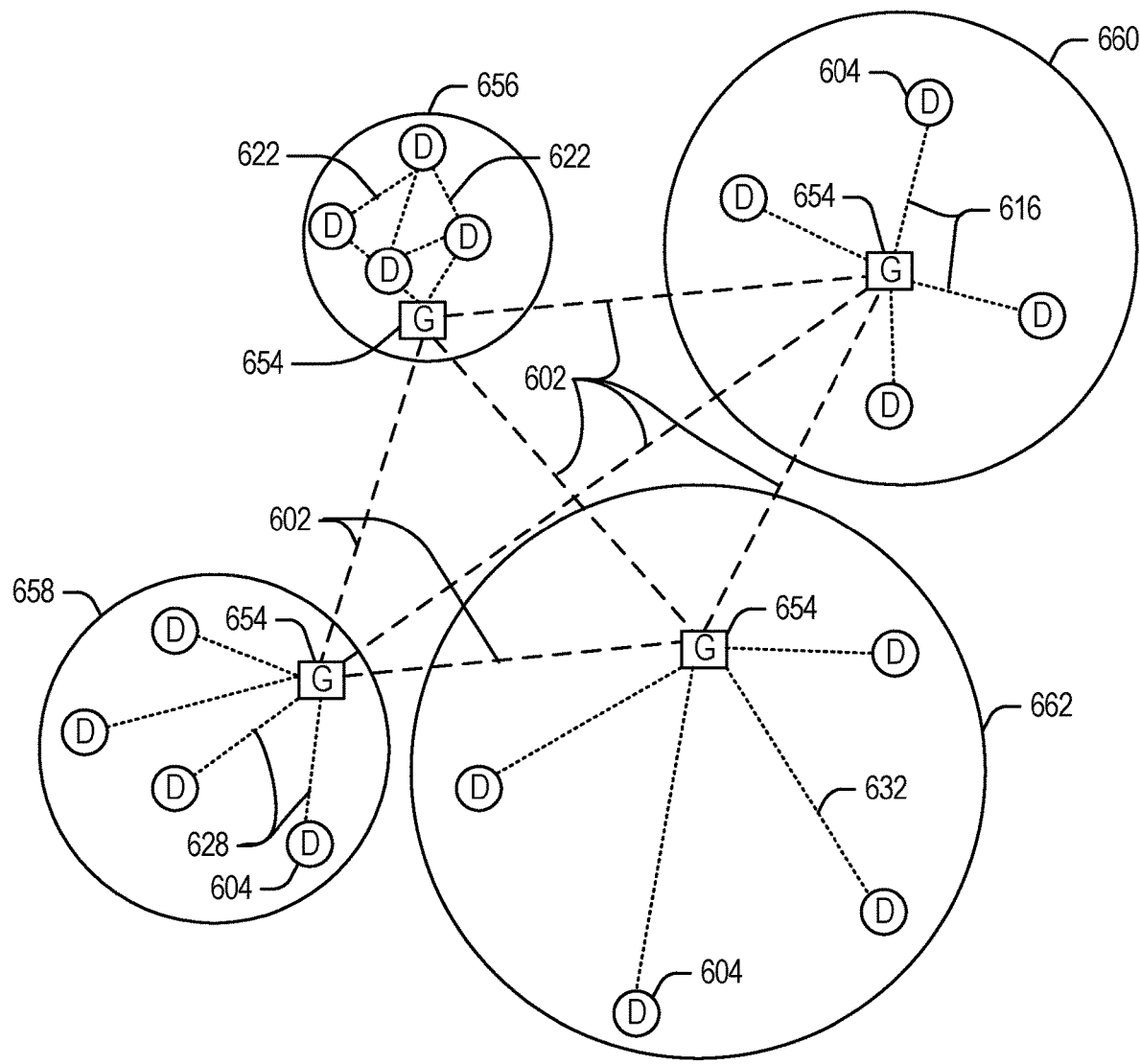
FIG. 6 is a block diagram of an example domain topology for Internet-of-Things (IoT) networks.

FIG. 6 illustrates an example domain topology for respective internet-of-things (IoT) networks coupled through links to respective gateways. In certain examples, the IoT involves a large number of computing devices interconnected to each other and to the Internet to provide functionality and data acquisition at very low levels. Thus, as used herein, an IoT device may include a semiautonomous device performing a function, such as sensing or control, among others, in communication with other IoT devices and a wider network, such as the Internet. For example, IoT devices can include the example networked device 202 of FIG. 2.

Often, IoT devices are limited in memory, size, or functionality, allowing larger numbers to be deployed for a similar cost to smaller numbers of larger devices. However, an IoT device may be a smart phone, laptop, tablet, or PC, or other larger device. Further, an IoT device may be a virtual device, such as an application on a smart phone or other computing device. IoT devices may include IoT gateways, used to couple IoT devices to other IoT devices and to cloud applications, for data storage, process control, and the like.

Networks of IoT devices may include commercial and home automation devices, such as water distribution systems, electric power distribution systems, pipeline control systems, plant control systems, light switches, thermostats, locks, cameras, alarms, motion sensors, and the like. The IoT devices may be accessible through remote computers, servers, and other systems, for example, to control systems or access data.

The future growth of the Internet and like networks may involve very large numbers of IoT devices. Accordingly, in the context of the techniques discussed herein, a number of innovations for such future networking will address the need for all these layers to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software; security enhancements; and the provision of services based on Quality of Service (QoS) terms specified in service level and service delivery agreements. As will be understood, the use of IoT devices and networks, such as those introduced herein, present a number of new challenges in a heterogeneous network of connectivity comprising a combination of wired and wireless technologies.

FIG. 6 provides a simplified drawing of a domain topology that can be used for a number of IoT networks including IoT devices 604 (e.g., an example of the processor platform 500, etc.), with the IoT networks 656, 658, 660, 662, coupled through backbone links 602 to respective gateways 654. For example, a number of IoT devices 604 can communicate with a gateway 654, and with each other through the gateway 654. To simplify the drawing, not every IoT device 604, or communications link (e.g., link 616, 622, 628, or 632) is labeled. The backbone links 602 may include any number of wired or wireless technologies, including optical networks, and may be part of a local area network (LAN), a wide area network (WAN), or the Internet. Additionally, such communication links facilitate optical signal paths among both IoT devices 604 and gateways 654, including the use of MUXing/deMUXing components that facilitate interconnection of the various devices.

The network topology may include any number of types of IoT networks, such as a mesh network provided with the network 656 using Bluetooth low energy (BLE) links 622. Other types of IoT networks that may be present include a wireless local area network (WLAN) network 658 used to communicate with IoT devices 604 through IEEE 802.11 (Wi-Fi®) links 628, a cellular network 660 used to communicate with IoT devices 604 through an LTE/LTE-A (4G) or 5G cellular network, and a low-power wide area (LPWA) network 662, for example, a LPWA network compatible with the LoRaWan specification promulgated by the LoRa alliance, or a IPv6 over Low Power Wide-Area Networks (LPWAN) network compatible with a specification promulgated by the Internet Engineering Task Force (IETF). Further, the respective IoT networks may communicate with an outside network provider (e.g., a tier 2 or tier 3 provider) using any number of communications links, such as an LTE cellular link, an LPWA link, or a link based on the IEEE 802.15.4 standard, such as Zigbee®. The respective IoT networks may also operate with use of a variety of network and internet application protocols such as Constrained Application Protocol (CoAP). The respective IoT networks can also be integrated with coordinator devices that provide a chain of links that forms cluster tree of linked devices and networks.

Each of these IoT networks can provide opportunities for new technical features, such as those as described herein. The improved technologies and networks may enable the exponential growth of devices and networks, including the use of IoT networks into as fog devices or systems. As the use of such improved technologies grows, the IoT networks may be developed for self-management, functional evolution, and collaboration, without needing direct human intervention. The improved technologies may even enable IoT networks to function without centralized controlled systems. Accordingly, the improved technologies described herein may be used to automate and enhance network management and operation functions far beyond current implementations.

In an example, communications between IoT devices 604, such as over the backbone links 602, can be protected by a decentralized system for authentication, authorization, and accounting (AAA). In a decentralized AAA system, distributed payment, credit, audit, authorization, and authentication systems may be implemented across interconnected heterogeneous network infrastructure. This allows systems and networks to move towards autonomous operations. In these types of autonomous operations, machines may even contract for human resources and negotiate partnerships with other machine networks. This can allow the achievement of mutual objectives and balanced service delivery against outlined, planned service level agreements as well as achieve solutions that provide metering, measurements, traceability and trackability. The creation of new supply chain structures and methods may enable a multitude of services to be created, mined for value, and collapsed without any human involvement.

Such IoT networks can be further enhanced by the integration of sensing technologies, such as sound, light, electronic traffic, facial and pattern recognition, smell, vibration, into the autonomous organizations among the IoT devices. The integration of sensory systems can allow systematic and autonomous communication and coordination of service delivery against contractual service objectives, orchestration and quality of service (QoS) based swarming and fusion of resources. Some of the individual examples of network-based resource processing include the following.

The mesh network 656, for instance, can be enhanced by systems that perform inline data-to-information transforms. For example, self-forming chains of processing resources comprising a multi-link network may distribute the transformation of raw data to information in an efficient manner, and the ability to differentiate between assets and resources and the associated management of each. Furthermore, the proper components of infrastructure and resource-based trust and service indices may be inserted to improve the data integrity, quality, assurance and deliver a metric of data confidence.

The WLAN network 658, for instance, can use systems that perform standards conversion to provide multi-standard connectivity, enabling IoT devices 604 using different protocols to communicate. Further systems may provide seamless interconnectivity across a multi-standard infrastructure comprising visible Internet resources and hidden Internet resources.

Communications in the cellular network 660, for instance, may be enhanced by systems that offload data, extend communications to more remote devices, or both. The LPWA network 662 can include systems that perform non-Internet protocol (IP) to IP interconnections, addressing, and routing. Further, each of the IoT devices 604 may include the appropriate transceiver for wide area communications with that device. Further, each IoT device 604 can include other transceivers for communications using additional protocols and frequencies.

Finally, clusters of IoT devices can be equipped to communicate with other IoT devices as well as with a cloud network. This can allow the IoT devices to form an ad-hoc network between the devices, allowing them to function as a single device, which may be termed a fog device. This configuration is discussed further with respect to FIG. 7 below.

Figure 7:
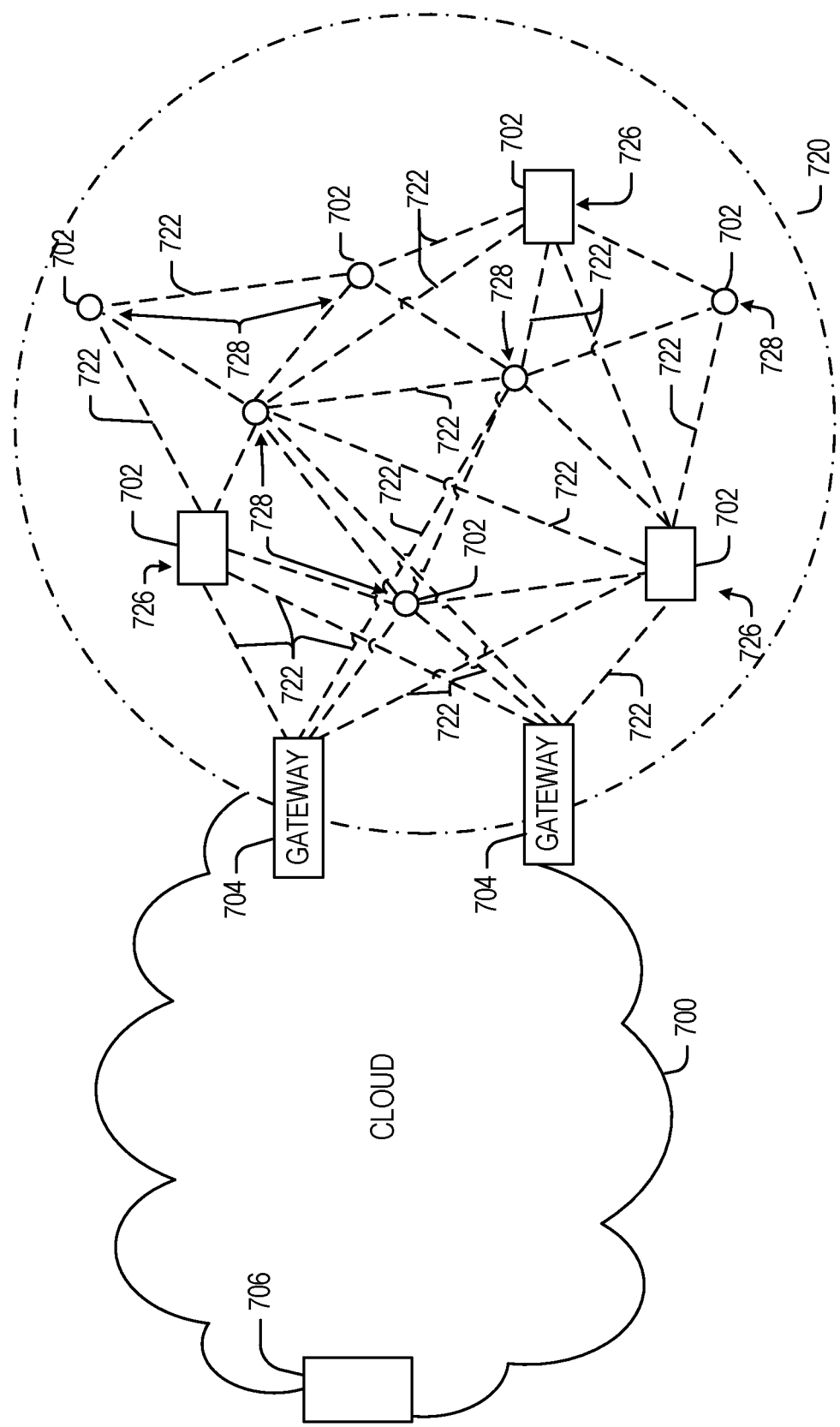
FIG. 7 is a block diagram of an example cloud computing network.

FIG. 7 illustrates a cloud computing network in communication with a mesh network of IoT devices (devices 702) operating as a fog device at the edge of the cloud computing network. The mesh network of IoT devices may be termed a fog 720, operating at the edge of the cloud 700. To simplify the diagram, not every IoT device 702 is labeled.

The fog 720 can be considered to be a massively interconnected network wherein a number of IoT devices 702 are in communications with each other, for example, by radio links 722. As an example, this interconnected network may be facilitated using an interconnect specification released by the Open Connectivity Foundation™ (OCF). This standard allows devices to discover each other and establish communications for interconnects. Other interconnection protocols may also be used, including, for example, the optimized link state routing (OLSR) Protocol, the better approach to mobile ad-hoc networking (B.A.T.M.A.N.) routing protocol, or the OMA Lightweight M2M (LWM2M) protocol, among others.

Three types of IoT devices 702 are shown in this example, gateways 704, data aggregators 726, and sensors 728, although any combinations of IoT devices 702 and functionality may be used. The gateways 704 may be edge devices that provide communications between the cloud 700 and the fog 720 and can also provide the backend process function for data obtained from sensors 728, such as motion data, flow data, temperature data, and the like. The data aggregators 726 can collect data from any number of the sensors 728 and perform the back end processing function for the analysis. The results, raw data, or both can be passed along to the cloud 700 through the gateways 704. The sensors 728 can be full IoT devices 702, for example, capable of both collecting data and processing the data. In some cases, the sensors 728 can be more limited in functionality, for example, collecting the data and allowing the data aggregators 726 or gateways 704 to process the data.

Communications from any IoT device 702 can be passed along a convenient path (e.g., a most convenient path) between any of the IoT devices 702 to reach the gateways 704. In these networks, the number of interconnections provide substantial redundancy, allowing communications to be maintained, even with the loss of a number of IoT devices 702. Further, the use of a mesh network can allow IoT devices 702 that are very low power or located at a distance from infrastructure to be used, as the range to connect to another IoT device 702 can be much less than the range to connect to the gateways 704.

The fog 720 provided from these IoT devices 702 can be presented to devices in the cloud 700, such as a server 706, as a single device located at the edge of the cloud 700, e.g., a fog device. In this example, the alerts coming from the fog device may be sent without being identified as coming from a specific IoT device 702 within the fog 720. In this fashion, the fog 720 can be considered a distributed platform that provides computing and storage resources to perform processing or data-intensive tasks such as data analytics, data aggregation, and machine-learning, among others.

In some examples, the IoT devices 702 can be configured using an imperative programming style, e.g., with each IoT device 702 having a specific function and communication partners. However, the IoT devices 702 forming the fog device can be configured in a declarative programming style, allowing the IoT devices 702 to reconfigure their operations and communications, such as to determine needed resources in response to conditions, queries, and device failures. As an example, a query from a user located at a server 706 about the operations of a subset of equipment monitored by the IoT devices 702 can result in the fog 720 device selecting the IoT devices 702, such as particular sensors 728, needed to answer the query. The data from these sensors 728 can then be aggregated and analyzed by any combination of the sensors 728, data aggregators 726, or gateways 704, before being sent on by the fog 720 device to the server 706 to answer the query. In this example, IoT devices 702 in the fog 720 can select the sensors 728 used based on the query, such as adding data from flow sensors or temperature sensors. Further, if some of the IoT devices 702 are not operational, other IoT devices 702 in the fog 720 device can provide analogous data, if available.

From the foregoing, it will be appreciated that example methods, systems, apparatus and articles of manufacture have been disclosed that reduce temperature of a networked device. Examples disclosed herein overcome problems associated with temperature reduction efforts by way of frequency scaling, which is a heavy-handed manner of thermal abatement that affect an entire device that is under the control of a throttled processor. To the extent that such frequency scaling reduces temperatures, such efforts also negatively affect all other systems that interact with the slowed-down processor, thereby causing a disappointing quality of service (QoS) experience for more than just communication processing speed (e.g., device responsivity is also thwarted by the frequency scaling technique). Accordingly, because examples disclosed herein target only network packet volumes to be processed, temperature reductions occur without crippling other non-communication related functions/systems of the network device.

Example 1 includes an apparatus to reduce a temperature of a device, the apparatus comprising a temperature threshold monitor to identify a temperature condition associated with the device, a window information retriever to retrieve a current value of a network receive capacity parameter, and a window adjustor to reduce the temperature of the device by generating a modified network receive capacity parameter, the modified network receive capacity parameter based on a ratio of the current value of the network receive capacity parameter and a decrease factor.

Example 2 includes the apparatus as defined in example 1, further including a window threshold monitor to compare the current value of the network receive capacity parameter to a data threshold, the window adjustor to generate the modified network receive capacity parameter when the data threshold is satisfied.

Example 3 includes the apparatus as defined in example 2, wherein the data threshold is satisfied when the current value of the network receive capacity parameter is greater than a minimum quantity of bytes to be advertised by the device.

Example 4 includes the apparatus as defined in example 2, wherein the data threshold is satisfied when the current value of the network receive capacity parameter is not greater than a minimum quantity of bytes to be advertised by the device, the window adjustor to maintain the network receive capacity parameter at a value equal to the data threshold during the temperature condition.

Example 5 includes the apparatus as defined in example 1, wherein the window adjustor is to identify a particular radio bearer to be targeted by the modified network receive capacity parameter.

Example 6 includes the apparatus as defined in example 5, wherein the particular radio bearer includes a default radio bearer.

Example 7 includes the apparatus as defined in example 1, wherein the temperature threshold monitor is to identify a transition of the temperature condition from an overtemperature condition to an undertemperature condition.

Example 8 includes the apparatus as defined in example 7, wherein the window adjustor is to generate a recovery value for the network receive capacity parameter, the recovery value based on a sum of the current value of the network receive capacity parameter and an additive increase factor.

Example 9 includes a tangible computer-readable storage medium comprising computer-readable instructions that, when executed, cause at least one processor to identify a temperature condition associated with a device, retrieve a current value of a network receive capacity parameter, and reduce a temperature of the device by generating a modified network receive capacity parameter, the modified network receive capacity parameter based on a ratio of the current value of the network receive capacity parameter and a decrease factor.

Example 10 includes the computer-readable storage medium as defined in example 9, wherein the instructions, when executed, cause the at least one processor to compare the current value of the network receive capacity parameter to a data threshold, and generate the modified network receive capacity parameter when the data threshold is satisfied.

Example 11 includes the computer-readable storage medium as defined in example 10, wherein the instructions, when executed, cause the at least one processor to identify the data threshold is satisfied when the current value of the network receive capacity parameter is greater than a minimum quantity of bytes to be advertised by the device.

Example 12 includes the computer-readable storage medium as defined in example 10, wherein the instructions, when executed, cause the at least one processor to identify the data threshold is satisfied when the current value of the network receive capacity parameter is not greater than a minimum quantity of bytes to be advertised by the device, and maintain the network receive capacity parameter at a value equal to the data threshold during the temperature condition.

Example 13 includes the computer-readable storage medium as defined in example 9, wherein the instructions, when executed, cause the at least one processor to identify a particular radio bearer to be targeted by the modified network receive capacity parameter.

Example 14 includes the computer-readable storage medium as defined in example 13, wherein the instructions, when executed, cause the at least one processor to identify the particular radio bearer as a default radio bearer.

Example 15 includes the computer-readable storage medium as defined in example 13, wherein the instructions, when executed, cause the at least one processor to identify a transition of the temperature condition from an overtemperature condition to an undertemperature condition.

Example 16 includes the computer-readable storage medium as defined in example 15, wherein the instructions, when executed, cause the at least one processor to generate a recovery value for the network receive capacity parameter, the recovery value based on a sum of the current value of the network receive capacity parameter and an additive increase factor.

Example 17 includes a computer-implemented method to reduce a temperature of a device, the method comprising identifying a temperature condition associated with the device, retrieving a current value of a network receive capacity parameter, and reducing the temperature of the device by generating a modified network receive capacity parameter, the modified network receive capacity parameter based on a ratio of the current value of the network receive capacity parameter and a decrease factor.

Example 18 includes the method as defined in example 17, further including comparing the current value of the network receive capacity parameter to a data threshold, and generating the modified network receive capacity parameter when the data threshold is satisfied.

Example 19 includes the method as defined in example 18, further including determining the data threshold is satisfied when the current value of the network receive capacity parameter is greater than a minimum quantity of bytes to be advertised by the device.

Example 20 includes the method as defined in example 18, further including determining the data threshold is satisfied when the current value of the network receive capacity parameter is not greater than a minimum quantity of bytes to be advertised by the device, and maintaining the network receive capacity parameter at a value equal to the data threshold during the temperature condition.

Example 21 includes the method as defined in example 17, further including identifying a particular radio bearer to be targeted by the modified network receive capacity parameter.

Example 22 includes the method as defined in example 21, wherein the particular radio bearer includes a default radio bearer.

Example 23 includes the method as defined in example 17, further including identifying a transition of the temperature condition from an overtemperature condition to an undertemperature condition.

Example 24 includes the method as defined in example 23, further including generating a recovery value for the network receive capacity parameter, the recovery value based on a sum of the current value of the network receive capacity parameter and an additive increase factor.

Example 25 includes a system to reduce a temperature of a device, the system comprising means for identifying a temperature condition associated with the device, means for retrieving a current value of a network receive capacity parameter, and means for reducing the temperature of the device by generating a modified network receive capacity parameter, the modified network receive capacity parameter based on a ratio of the current value of the network receive capacity parameter and a decrease factor.

Example 26 includes the system as defined in example 25, further including means for comparing the current value of the network receive capacity parameter to a data threshold, the reducing means to generate the modified network receive capacity parameter when the data threshold is satisfied.

Example 27 includes the system as defined in example 26, wherein the data threshold is satisfied when the current value of the network receive capacity parameter is greater than a minimum quantity of bytes to be advertised by the device.

Example 28 includes the system as defined in example 26, wherein the data threshold is satisfied when the current value of the network receive capacity parameter is not greater than a minimum quantity of bytes to be advertised by the device, the reducing means to maintain the network receive capacity parameter at a value equal to the data threshold during the temperature condition.

Example 29 includes the system as defined in example 25, wherein the reducing means is to identify a particular radio bearer to be targeted by the modified network receive capacity parameter.

Example 30 includes the system as defined in example 29, wherein the particular radio bearer includes a default radio bearer.

Example 31 includes the system as defined in example 25, wherein the identifying means is to identify a transition of the temperature condition from an overtemperature condition to an undertemperature condition.

Example 32 includes the system as defined in example 31, wherein the reducing means is to generate a recovery value for the network receive capacity parameter, the recovery value based on a sum of the current value of the network receive capacity parameter and an additive increase factor.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to reduce a temperature of a device, the apparatus comprising:
  temperature threshold monitoring circuitry to identify a temperature condition associated with the device;
  window information retrieving circuitry to retrieve a current value of a network receive capacity parameter;
  window threshold monitoring circuitry to:
    in response to the temperature condition satisfying a thermal threshold, compare the current value of the network receive capacity parameter to a first data threshold; and
    in response to the temperature condition not satisfying the thermal threshold, compare the current value of the network receive capacity parameter to a second data threshold; and window adjusting circuitry to:
in response to the current value of the network receive capacity parameter satisfying the first data threshold, adjust a receive window by generating a modified network receive capacity parameter, the modified network receive capacity parameter based on a lower one of (a) a ratio of the current value of the network receive capacity parameter and a decrease factor or (b) an original value of the network receive capacity parameter, the modified network receive capacity parameter to decrease the receive window and reduce the temperature of the device; and
in response to the current value of the network receive capacity parameter satisfying the second data threshold, adjust the receive window by generating a recovery value for the network receive capacity parameter, the recovery value based on a lower one of (a) a sum of the current value of the network receive capacity parameter and an additive increase factor or (b) the original value of the network receive capacity parameter, the recovery value to increase the receive window and increase bandwidth of the device.

2. The apparatus as defined in claim 1, wherein the first data threshold is satisfied when the current value of the network receive capacity parameter is greater than a minimum quantity of bytes to be advertised by the device.

3. The apparatus as defined in claim 1, wherein the first data threshold is not satisfied when the current value of the network receive capacity parameter is not greater than a minimum quantity of bytes to be advertised by the device, the window adjusting circuitry to maintain the network receive capacity parameter at a value equal to the first data threshold during the temperature condition.

4. The apparatus as defined in claim 1, wherein the window adjusting circuitry is to identify a particular radio bearer to be targeted by the modified network receive capacity parameter.

5. The apparatus as defined in claim 4, wherein the particular radio bearer includes a default radio bearer.

6. The apparatus as defined in claim 1, wherein the temperature threshold monitoring circuitry is to identify a transition of the temperature condition from an overtemperature condition to an undertemperature condition.

7. A non-transitory computer-readable storage medium comprising computer-readable instructions that, when executed, cause at least one processor to:
identify a temperature condition associated with a device;
in response to the temperature condition satisfying a thermal threshold, retrieve a current value of a network receive capacity parameter;
in response to the temperature condition satisfying a thermal threshold, compare the current value of the network receive capacity parameter to a first data threshold; in response to the temperature condition not satisfying the thermal threshold, compare the current value of the network receive capacity parameter to a second data threshold;
in response to the current value of the network receive capacity parameter satisfying the first data threshold, adjust a receive window reduce the temperature of the device by generating a modified network receive capacity parameter, the modified network receive capacity parameter based on a lower one of (a) a ratio of the current value of the network receive capacity parameter and a decrease factor or (b) an original value of the network receive capacity parameter, the modified network receive capacity parameter to decrease the receive window and reduce the temperature of the device; and
in response to the current value of the network receive capacity parameter satisfying the second data threshold, adjust the receive window by generating a recovery value for the network receive capacity parameter, the recovery value based on a lower one of (a) a sum of the current value of the network receive capacity parameter and an additive increase factor or (b) the original value of the network receive capacity parameter, the recovery value to increase the receive window and increase bandwidth of the device.

8. The computer-readable storage medium as defined in claim 7, wherein the instructions, when executed, cause the at least one processor to identify the first data threshold is satisfied when the current value of the network receive capacity parameter is greater than a minimum quantity of bytes to be advertised by the device.

9. The computer-readable storage medium as defined in claim 7, wherein the instructions, when executed, cause the at least one processor to:
identify the first data threshold is not satisfied when the current value of the network receive capacity parameter is not greater than a minimum quantity of bytes to be advertised by the device; and
maintain the network receive capacity parameter at a value equal to the first data threshold during the temperature condition.

10. The computer-readable storage medium as defined in claim 7, wherein the instructions, when executed, cause the at least one processor to identify a particular radio bearer to be targeted by the modified network receive capacity parameter.

11. The computer-readable storage medium as defined in claim 10, wherein the instructions, when executed, cause the at least one processor to identify the particular radio bearer as a default radio bearer.

12. The computer-readable storage medium as defined in claim 10, wherein the instructions, when executed, cause the at least one processor to identify a transition of the temperature condition from an overtemperature condition to an undertemperature condition.

13. A computer-implemented method to reduce a temperature of a device, the method comprising:
identifying a temperature condition associated with the device;
retrieving a current value of a network receive capacity parameter;
in response to the temperature condition satisfying a thermal threshold, comparing the current value of the network receive capacity parameter to a first data threshold;
in response to the temperature condition not satisfying the thermal threshold, comparing the current value of the network receive capacity parameter to a second data threshold;
in response to the current value of the network receive capacity parameter satisfying the first data threshold, adjust a receive window by generating a modified network receive capacity parameter, the modified network receive capacity parameter based on a lower one of (a) a ratio of the current value of the network receive capacity parameter and a decrease factor or (b) an original value of the network receive capacity parameter, the modified network receive capacity parameter to decrease the receive window and reduce the temperature of the device; and in response to the current value of the network receive capacity parameter satisfying the second data threshold, adjusting the receive window by generating a recovery value for the network receive capacity parameter, the recovery value based on a lower one of (a) a sum of the current value of the network receive capacity parameter and an additive increase factor or (b) the original value of the network receive capacity parameter, the recovery value to increase the receive window and increase bandwidth of the device.

14. The method as defined in claim 13, further including determining the first data threshold is satisfied when the current value of the network receive capacity parameter is greater than a minimum quantity of bytes to be advertised by the device.

15. The method as defined in claim 13, further including:
determining the first data threshold is not satisfied when the current value of the network receive capacity parameter is not greater than a minimum quantity of bytes to be advertised by the device; and
maintaining the network receive capacity parameter at a value equal to the first data threshold during the temperature condition.

16. The method as defined in claim 13, further including identifying a particular radio bearer to be targeted by the modified network receive capacity parameter.

17. The method as defined in claim 16, wherein the particular radio bearer includes a default radio bearer.

18. The method as defined in claim 13, further including identifying a transition of the temperature condition from an overtemperature condition to an undertemperature condition.

* * * * *